US012696695B2

(12) United States Patent
Zhang et al.

(10) Patent No.: US 12,696,695 B2
(45) Date of Patent: Jul. 28, 2026

(54) ATOMIC LAYER DEPOSITION OF PASSIVATION LAYER

(71) Applicant: Tokyo Electron Limited, Tokyo (JP)

(72) Inventors: Du Zhang, Albany, NY (US); Koki Mukaiyama, Miyagi (JP); Takatoshi Orui, Hillsboro, OR (US); Tomohiko Niizeki, Miyagi (JP); Maju Tomura, Miyagi (JP); Yoshihide Kihara, Miyagi (JP); Mingmei Wang, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 332 days.

(21) Appl. No.: 18/362,150

(22) Filed: Jul. 31, 2023

(65) Prior Publication Data

US 2025/0046603 A1 Feb. 6, 2025

(51) Int. Cl.
| | |
|---|---|
| *H10P 14/60* | (2026.01) |
| *H10P 14/20* | (2026.01) |
| *H10P 14/692* | (2026.01) |
| *H10P 50/00* | (2026.01) |
| *H10P 50/24* | (2026.01) |

(52) U.S. Cl.
CPC ...... *H10P 14/6336* (2026.01); *H10P 14/3406* (2026.01); *H10P 14/3454* (2026.01); *H10P 14/6339* (2026.01); *H10P 14/668* (2026.01); *H10P 14/6939* (2026.01); *H10P 50/242* (2026.01); *H10P 50/692* (2026.01)

(58) Field of Classification Search
CPC ......... H01L 21/02274; H01L 21/02175; H01L 21/02205; H01L 21/0228; H01L 21/02527; H01L 21/02592; H01L 21/3065; H01L 21/3081; H01L 21/31116;

H01L 21/31144; H10P 14/6336; H10P 14/3406; H10P 14/3454; H10P 14/6339; H10P 14/668; H10P 14/6939; H10P 50/242; H10P 50/692; H10P 50/283; H10P 50/73
See application file for complete search history.

(56) References Cited

U.S. PATENT DOCUMENTS

| | | | | |
|---|---|---|---|---|
| 6,642,107 | B2 * | 11/2003 | Seo ...................... | H10D 64/035 |
| | | | | 438/257 |
| 7,378,129 | B2 * | 5/2008 | Kraus ..................... | C23C 16/34 |
| | | | | 427/255.394 |
| 9,673,058 | B1 | 6/2017 | Briggs et al. | |

(Continued)

FOREIGN PATENT DOCUMENTS

| | | |
|---|---|---|
| CN | 114724923 A | 7/2022 |
| KR | 20210024234 A | 3/2021 |

OTHER PUBLICATIONS

International Search Report and Written Opinion, PCT/US2024/029411, Mailed Aug. 28, 2024, Total pages 13.

*Primary Examiner* — Dale E Page
*Assistant Examiner* — Quovaunda Jefferson
(74) *Attorney, Agent, or Firm* — Slater Matsil, LLP

(57) ABSTRACT

A method for processing a substrate that includes: forming a passivation layer over sidewalls of a recess in a carbon-containing layer over a substrate by a cyclic passivation process including a plurality of cycles, each of the plurality of cycles including, exposing the substrate to a first gas including a refractory metal in the absence of a plasma, and after exposing to the first gas, exposing the substrate to a second gas including oxygen or nitrogen.

21 Claims, 12 Drawing Sheets

(56) References Cited

U.S. PATENT DOCUMENTS

| | | |
|---|---|---|
| 10,566,209 B2 | 2/2020 | Nagatomo et al. |
| 10,847,377 B2 | 11/2020 | Dole et al. |
| 2016/0163557 A1 | 6/2016 | Hudson et al. |
| 2017/0076945 A1* | 3/2017 | Hudson ............... H01J 37/3244 |
| 2017/0352586 A1* | 12/2017 | Venkatasubramanian ................... H01L 21/02274 |
| 2020/0035505 A1* | 1/2020 | Jiang ................... H01L 21/0228 |
| 2022/0189781 A1 | 6/2022 | Chang et al. |
| 2022/0216049 A1 | 7/2022 | Shi et al. |
| 2022/0375759 A1 | 11/2022 | Kim et al. |

\* cited by examiner

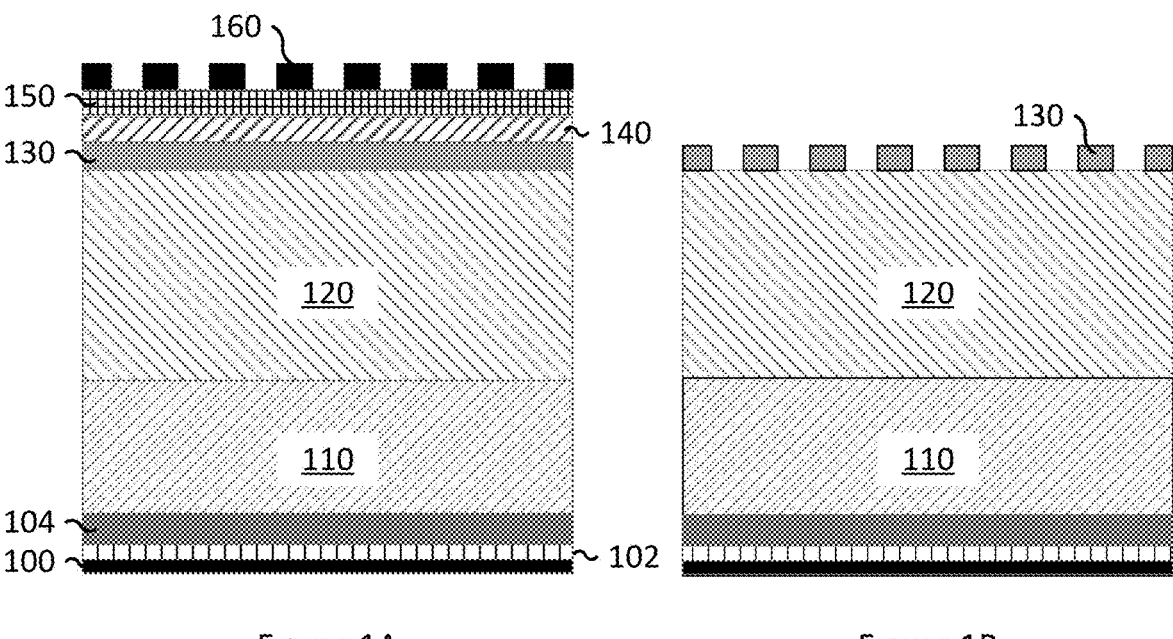
FIGURE 1A                              FIGURE 1B
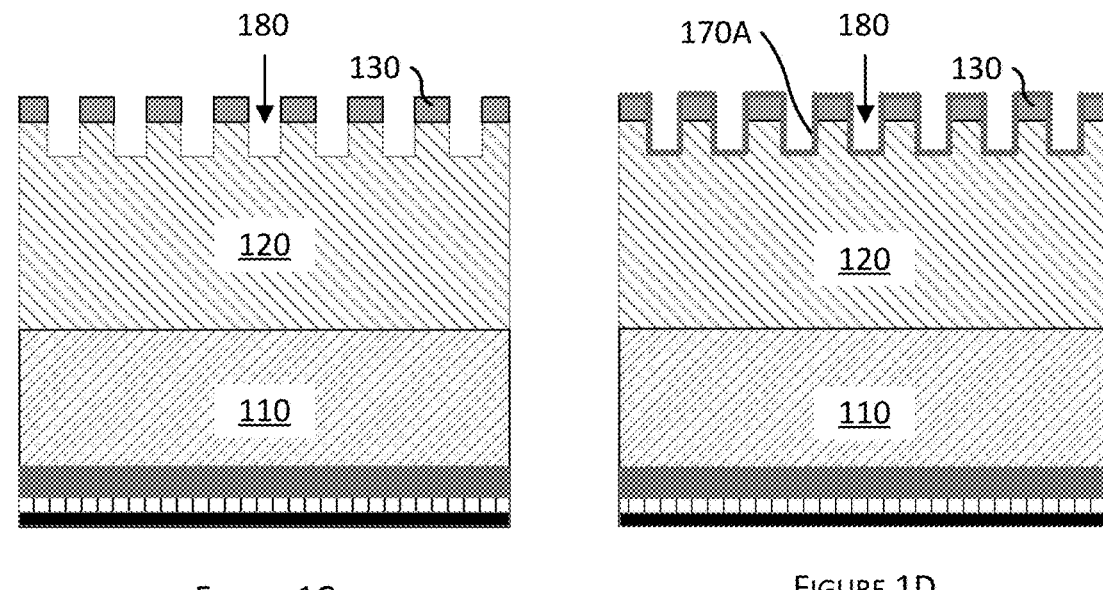
FIGURE 1C                              FIGURE 1D

CYCLIC PASSIVATION PROCESS

EXPOSE SUBSTRATE TO FIRST GAS
COMPRISING REFRACTORY METAL
IN ABSENCE OF PLASMA — 710

EXPOSE SUBSTRATE TO SECOND
GAS COMPRISING OXYGEN OR
NITROGEN — 730

ATOMIC LAYER DEPOSITION OF PASSIVATION LAYER

TECHNICAL FIELD

The present invention relates generally to methods of processing a substrate, and, in particular embodiments, to atomic layer deposition (ALD) of passivation layer.

BACKGROUND

Generally, a semiconductor device, such as an integrated circuit (IC) is fabricated by sequentially depositing and patterning layers of dielectric, conductive, and semiconductor materials over a substrate to form a network of electronic components and interconnect elements (e.g., transistors, resistors, capacitors, metal lines, contacts, and vias) integrated in a monolithic structure. Many of the processing steps used to form the constituent structures of semiconductor devices are performed using plasma processes.

The semiconductor industry has repeatedly reduced the minimum feature sizes in semiconductor devices to a few nanometers to increase the packing density of components. Accordingly, the semiconductor industry increasingly demands plasma processing technology to provide processes for patterning features with accuracy, precision, and profile control, often at atomic scale dimensions. Meeting this challenge along with the uniformity and repeatability needed for high volume IC manufacturing requires further innovations of plasma processing technology.

SUMMARY

In accordance with an embodiment of the present invention, a method for processing a substrate that includes: forming a passivation layer over sidewalls of a recess in a carbon-containing layer over a substrate by a cyclic passivation process including a plurality of cycles, each of the plurality of cycles including, exposing the substrate to a first gas including a refractory metal in the absence of a plasma, and after exposing to the first gas, exposing the substrate to a second gas including oxygen or nitrogen.

In accordance with an embodiment of the present invention, a method for processing a substrate that includes: forming a carbon-containing layer over a dielectric layer of a substrate; forming an initial recess in the carbon-containing layer by exposing the substrate to a first plasma, the initial recess including sidewalls; forming a passivation layer over the sidewalls by exposing the substrate to a metal precursor gas including a halide of a refractory metal, and exposing the substrate to a second gas including oxygen or nitrogen; and extending the initial recess by exposing the substrate to the first plasma, the passivation layer covering the sidewalls during the extending.

In accordance with an embodiment of the present invention, a method for processing a substrate that includes: performing a plurality of cycles of a cyclic passivation process to form a passivation layer over sidewalls of an initial recess, each cycle of the cyclic passivation process including exposing the substrate to a first gas including a metal halide in the absence of a plasma, the metal halide including tungsten, tin, niobium, titanium, or molybdenum, and exposing the substrate to a second gas including oxygen or nitrogen; extending the initial recess using an anisotropic plasma etch process, the passivation layer covering the sidewalls during the extending.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A-1J illustrate cross sectional views of an example substrate during an example process of semiconductor fabrication comprising a cyclic etch process and an atomic layer deposition (ALD) of a passivation layer at various stages in accordance with various embodiments, wherein FIG. 1A illustrates an incoming substrate comprising a patterning layer stack, a carbon-containing layer, and an underlying layer, FIG. 1B illustrates the substrate after patterning a hard mask layer, FIG. 1C illustrates the substrate after a first anisotropic plasma etch, FIG. 1D illustrates the substrate after a first exposure to a metal-containing precursor gas, FIG. 1E illustrates the substrate after a first exposure to a co-reactant gas, FIG. 1F illustrates the substrate after a second anisotropic plasma etch, FIG. 1G illustrates the substrate after a second exposure to the metal-containing precursor gas followed by a second exposure to the co-reactant gas, FIG. 1H illustrates the substrate after a plurality of etch and passivation cycles, FIG. 1I illustrates the substrate after a final exposure to the metal-containing precursor gas followed by a final exposure to the co-reactant gas after the cyclic etch process, and FIG. 1J illustrates the substrate after an anisotropic plasma etch of the underlying layer;

FIGS. 2A-2C illustrate cross sectional views of an example substrate during a cyclic etch process and an ALD of a passivation layer at various stages in accordance with alternate embodiments, wherein FIG. 2A illustrates an substrate comprising a patterned hard mask layer, a carbon-containing layer, and an underlying layer after a first exposure to a metal-containing precursor gas, FIG. 2B illustrates the substrate after a first exposure to a co-reactant gas, FIG. 2C illustrates the substrate after a first anisotropic plasma etch;

FIGS. 3A-3B illustrate cross sectional views of an example substrate during an example process of semiconductor fabrication comprising a cyclic etch process and an atomic layer deposition (ALD) of a passivation layer at various stages in accordance with other embodiments, wherein FIG. 3A illustrates the substrate comprising a patterned carbon-containing layer and an underlying layer after an initial etch of the underlying layer, and FIG. 3B illustrates the substrate after the ALD of the passivation layer and an anisotropic plasma etch of the underlying layer;

FIGS. 7A-7C illustrate process flow charts of methods of ALD of passivation layer in accordance with various embodiments, wherein FIG. 7A illustrates an embodiment process flow, FIG. 7B illustrates an alternate embodiment process flow, and FIG. 7C illustrate another alternate embodiment process flow.

DETAILED DESCRIPTION OF ILLUSTRATIVE EMBODIMENTS

Figures 1E, 1F:
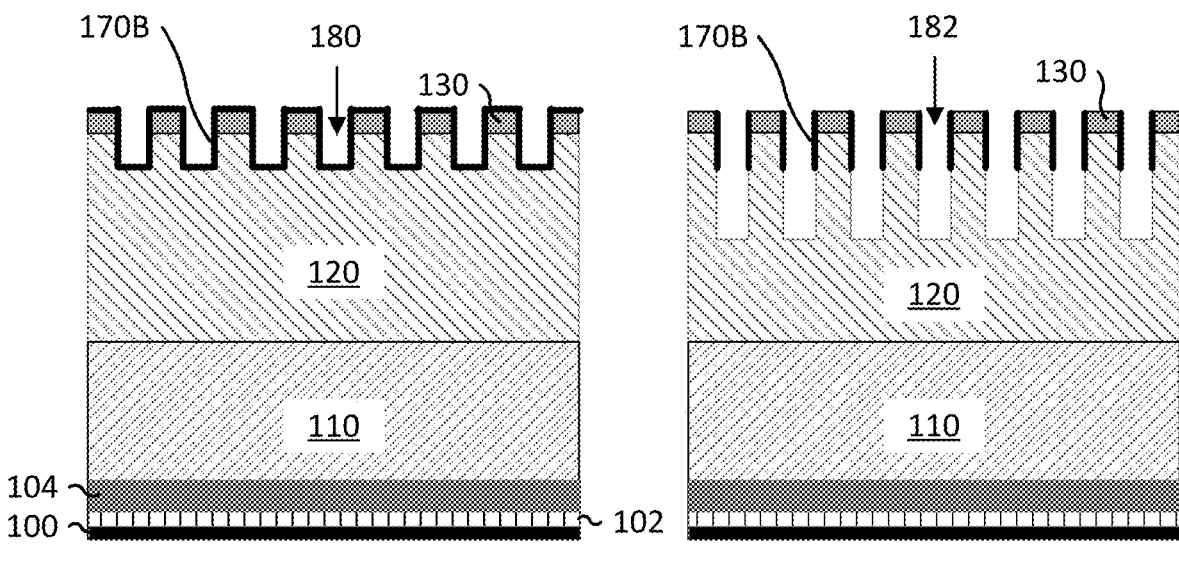

This application relates to fabrication of semiconductor devices, for example, integrated circuits comprising semiconductor devices, and more particularly to high capacity three-dimensional (3D) memory devices, such as a 3D-NAND (or vertical-NAND), 3D-NOR, or dynamic random access memory (DRAM) device. The fabrication of such devices may generally require forming conformal, high aspect ratio (HAR) features (e.g., a contact hole) of a circuit element. Features with aspect ratio (ratio of height of the feature to the width of the feature) higher than 50:1 are generally considered to be high aspect ratio features, and in some cases fabricating a higher aspect ratio such as 100:1 may be desired for advanced 3D semiconductor devices. In such applications, HAR features may be formed in a dielectric layer (e.g., silicon oxide, silicon nitride, or oxide/nitride layer stack) by a highly anisotropic plasma etch process with high fidelity. To pattern the dielectric layer into the HAR features, an etch mask (e.g., amorphous carbon layer) may also need to be patterned with high fidelity and HAR. However, as the target AR increases, the high fidelity of etch profile for the etch mask as well as the dielectric layer becomes harder to maintain with conventional HAR etch methods. For example, with insufficient sidewall passivation, bowing may worsen during an elongated etch process time.

Embodiments of the present application disclose methods of passivation, particularly the methods of atomic layer deposition (ALD) of a metal-containing passivation layer. The ALD methods in various embodiments may use a cyclic exposure to a metal-containing precursor (e.g., a halides of W, Sn, Nb, Ti, or Mo) and a co-reactant (e.g., $H_2O$ or $NH_3$). The metal-containing passivation layer may advantageously formed conformally over the sidewalls in a recess, for example, a carbon-containing layer, which may then improve the etch profile in a subsequent plasma etch process to form a HAR feature in the carbon-containing layer with sidewall passivation. The inventors of this application have identified that the chemical composition of the passivation layer may be advantageously selected to eliminate or minimize undesired residues (e.g., salts) from the passivation layer during the subsequent plasma etch process.

In the following, FIGS. 1A-1J illustrate steps of semiconductor fabrication including the cyclic etch process and ALD of passivation layer in accordance with various embodiments. Process steps in accordance with alternate embodiments are described in FIGS. 2A-2C and 3A-3B. Energy level diagrams for the adsorption of example metal-containing precursor ($WF_6$ and $MoF_6$) for the passivation layer formation are described in FIGS. 4-6. Several embodiment process flows of the cyclic etch process and ALD of passivation layer are then described referring to FIGS. 7A-7C. An example plasma processing tool for the embodiment methods is illustrated in FIG. 8. All Figures in the disclosure, including the aspect ratios of features, are not to scale and for illustration purposes only. In this disclosure, any list that presents possible compositions, conditions, or process variations includes any reasonable combination thereof, and thus the term "or" used in the list does not indicate any exclusive selection of a particular composition, condition, or process variation.

FIG. 1A illustrates a cross sectional view of an incoming substrate 100. The substrate 100 may comprise, from bottom to top as illustrated in FIG. 1A, a first intermediate layer 102, a second intermediate layer 104, an underlying layer 110, a carbon-containing layer 120, a hard mask layer 130, a third intermediate layer 140, a fourth intermediate layer 150, and a patterned layer 160.

In one or more embodiments, the substrate 100 may be a silicon wafer, or a silicon-on-insulator (SOI) wafer. In certain embodiments, the substrate may comprise a silicon germanium wafer, silicon carbide wafer, gallium arsenide wafer, gallium nitride wafer and other compound semiconductors. In other embodiments, the substrate comprises heterogeneous layers such as silicon germanium on silicon, gallium nitride on silicon, silicon carbon on silicon, as well layers of silicon on a silicon or SOI substrate.

In various embodiments, the substrate 100 is a part of, or including, a semiconductor device, and may have undergone a number of steps of processing following, for example, a conventional process. For example, the semiconductor structure may comprise a substrate 100 in which various device regions are formed. At this stage, the substrate 100 may include isolation regions such as shallow trench isolation (STI) regions as well as other regions formed therein.

As further illustrated in FIG. 1A, the substrate 100 may include the first and the second intermediate layers 102 and 104 and the underlying layer 110, which collectively may be considered a bottom layer of a semiconductor device comprising the substrate 100. In certain embodiments, the first and the second intermediate layers 102 and 104 and the underlying layer 110 are a dielectric layer, and may comprise silicon oxide, silicon nitride, an alternating layer stack of oxide/nitride layers, or any suitable materials that might be used, e.g., in a three-dimensional 3D-NAND stack. Each of the first and the second intermediate layers 102 and 104 and underlying layer 110 is described further below.

The first intermediate layer 102 may be an oxide layer such as a silicon oxide layer and may function as an etch stop layer in various embodiments. The first intermediate layer 102 may be deposited over the substrate 100 using an appropriate technique such as vapor deposition including chemical vapor deposition (CVD), physical vapor deposition (PVD), atomic layer deposition (ALD), as well as other plasma processes such as plasma enhanced CVD (PECVD) and other processes. In one embodiment, the first intermediate layer 102 has a thickness between 10 nm and 30 nm.

The second intermediate layer 104 may be a silicon-based layer, such as a silicon nitride layer, and may function as a blocking layer to further support an etch stop layer in various embodiments. The second intermediate layer 104 may be deposited using an appropriate technique such as vapor deposition including chemical vapor deposition (CVD), physical vapor deposition (PVD), atomic layer deposition (ALD), as well as other plasma processes such as plasma enhanced CVD (PECVD) and other processes. In one embodiment, the second intermediate layer 104 has a thickness between 200 nm and 250 nm. Although these particular intermediate layers (i.e., the first and the second intermediate layers 102 and 104) between the substrate 100 and the underlying layer 110 are illustrated and described, the substrate 100 may omit these particular intermediate layers and/or include different intermediate layers.

The underlying layer 110 may be formed over the second intermediate layer 104. In various embodiments, the underlying layer 110 is a second target layer that is to be patterned into one or more high aspect ratio (HAR) features using the carbon-containing layer 120 as an etch mask, as described further below. The feature being etched into another layer (e.g., the underlying layer 110 or, as described below, the carbon-containing layer 120) may be any suitable feature. For example, although this disclosure primarily describes "recesses" with respect to the figures of this disclosure, it will be appreciated that other suitable features might be formed in a semiconductor layer, including lines, holes, trenches, vias, and/or other suitable structures, using embodiments of this disclosure. In one embodiment, the underlying layer 110 may be a silicon oxide layer. In various embodiments, the underlying layer 110 may include a stack of films. In certain embodiments, the underlying layer 110 may comprise films of dielectric and/or conductive materials, such as oxide, silicon oxide, silicon nitride, silicon oxynitride, silicon carbide, titanium nitride, tantalum nitride, their alloys, and combinations thereof. In one embodiment, the underlying layer 110 may be alternating silicon oxide/silicon nitride layers (O/N/O/N layer stack) useful for 3D-NAND applications. The underlying layer 110 may be deposited using an appropriate technique such as vapor deposition including chemical vapor deposition (CVD), physical vapor deposition (PVD), atomic layer deposition (ALD), as well as other plasma processes such as plasma enhanced CVD (PECVD) and other processes. In one embodiment, the underlying layer 110 has a thickness between 1 μm and 4 μm.

As still illustrated in FIG. 1A, the carbon-containing layer 120 is formed over the underlying layer 110. In various embodiments, as described further below, the carbon-containing layer 120 may be a first target layer to be etched to form a HAR feature such that it provides the sufficient masking ability as an etch mask layer in subsequent etch steps (e.g., for etching the underlying layer 110). The carbon-containing layer 120 may be deposited over the underlying layer 110 using, for example, an appropriate spin-coating technique or a vapor deposition technique such as chemical vapor deposition (CVD), physical vapor deposition (PVD), atomic layer deposition (ALD), as well as other plasma processes such as plasma enhanced CVD (PECVD) and other processes. In one embodiment, the carbon-containing layer 120 has a thickness between 0.2 μm and 5 μm. In an alternate embodiment, the carbon-containing layer 120 has a thickness between 1 μm and 5 μm. In another alternate embodiment, the carbon-containing layer 120 has a thickness between 2 μm and 4 μm. In various embodiments, carbon-containing layer 120 may be amorphous carbon layer (ACL). In alternate embodiments, the carbon-containing layer 120 may be other suitable organic materials as a carbon mask, for example, spin-on carbon hard mask (SOH) materials, or silicon-containing anti-reflective coating films (SiARC). These materials may be formed by a coating process such as spin-on process.

The hard mask layer 130 may be formed over the carbon-containing layer 120. In various embodiments, the hard mask layer 130 may be an etch mask for pattering of the carbon-containing layer 120 during a cyclic etch process with ALD sidewall passivation. The hard mask layer 130 may comprise silicon oxide in one embodiment. In various embodiments, the hard mask layer 130 may comprise silicon nitride, silicon carbonitride (SiCN), silicon oxynitride (SiON), or silicon oxycarbide (SiOC). In alternate embodiments, the hard mask layer 130 may comprise titanium nitride. Further, the hard mask layer 130 may be a stacked hard mask comprising, for example, two or more layers using two different materials. The first hard mask of the hard mask layer 130 may comprise a metal-based layer such as titanium nitride, titanium, tantalum nitride, tantalum, tungsten based compounds, ruthenium based compounds, or aluminum based compounds, and the second hard mask material of the hard mask layer 130 may comprise a dielectric layer such as SiO2, silicon nitride, SiCN, SiOC, silicon oxynitride, silicon carbide, amorphous silicon, or polycrystalline silicon. The hard mask layer 130 may be deposited using deposition techniques such as vapor deposition including chemical vapor deposition (CVD), physical vapor deposition (PVD), and atomic layer deposition (ALD), as well as other plasma processes such as plasma enhanced CVD (PECVD), sputtering, and other processes. In one embodiment, the hard mask layer 130 has a thickness of about 50 nm to about 500 nm, e.g., 100 nm to 300 nm in one embodiment.

The third intermediate layer 140 may be formed over the hard mask layer 130. The third intermediate layer 140 is an optional layer and may be an organic dielectric layer (ODL) in various embodiments. In certain embodiments, the ODL may comprise a photo-sensitive organic polymer or an etch type organic compound. In certain embodiments, the ODL may be polyacrylate resin, phenol resin, polyamide resin, polyimide resin, unsaturated polyester resin, polyphenylenether resin polyphenylenesulfide resin, or benzocyclobutene (BCB). The third intermediate layer 140 may be deposited over the hard mask layer 130 using an appropriate spin-coating technique. In one embodiment, the intermediate layer 140 has a thickness between 100 nm and 800 nm.

Further, as illustrated in FIG. 1A, the fourth intermediate layer 150 may be formed over the third intermediate layer 140. The fourth intermediate layer 150 may be silicon anti-reflective coating (SiARC) films or other anti-reflective coating materials. The fourth intermediate layer 150 may be deposited over the third intermediate layer 140 using, for example, an appropriate spin-coating technique or a vapor deposition process. In one embodiment, the fourth intermediate layer 150 has a thickness between 20 nm and 40 nm.

Although these particular third and fourth intermediate layers 140 and 150 are illustrated and described, this disclosure contemplates the substrate 100 omitting the third intermediate layer 140 and/or the fourth intermediate layer 150, or including different intermediate layers.

In various embodiments, the patterned layer 160 may be a photoresist layer and patterned to enable formation of respective features in the carbon-containing layer 120. For example, the patterned layer 160 may serve as a first etch mask when forming respective features in the hard mask layer 130, and subsequently the formed features in the hard mask layer 130 may serve as a second etch mask during a cyclic etch process for patterning the carbon-containing layer 120 such that the pattern of the patterned layer 160 may be transferred to the carbon-containing layer 120. In certain embodiments, the photoresist layer may comprise 248 nm resists, 193 nm resists, 157 nm resists, EUV (extreme ultraviolet) resists, or electron beam (EB) sensitive resists. The patterned layer 160 may be deposited over the fourth intermediate layer 150 using a suitable spin-coating technique. In one embodiment, the patterned layer 160 has a thickness between 50 nm and 60 nm thick. The pattern of the patterned layer 160 may be formed using an appropriate lithography process, such as a UV lithography process or an EB lithography process.

Features to be patterned using the patterned layer 160 may have a desired critical dimension, or width, for the patterned layer 160. In one embodiment, the width may be between 70 nm and 250 nm. In an alternate embodiment, the width may be about 90 nm. These values are provided for example purposes only, as the features to be patterned using the patterned layer 160 may have any suitable critical dimension. The width may be the critical dimension achievable for a photoresist film by the lithography system after developing.

FIG. 1B illustrates a cross sectional view of the substrate 100 after patterning the hard mask layer 130.

In FIG. 1B, a plasma etch process may be performed to pattern the hard mask layer 130 using the patterned layer 160 as an etch mask. The third and the fourth intermediate layers 140 and 150 and the patterned layer 160 may be removed as a part of this etch process in various embodiments. Although only the hard mask layer 130 is illustrated over the carbon-containing layer 120 in the example, this disclosure also contemplates a portion of the third intermediate layer 140 that may remain over the hard mask layer 130. In the following, a cyclic etch process to form a high aspect ratio (HAR) feature in the carbon-containing layer 120 with sidewall passivation with atomic layer deposition (ALD) is further described (FIGS. 1C-1H).

FIG. 1C illustrates a cross sectional view of the substrate 100 after a first anisotropic plasma etch to form an initial recess 180.

Since the methods of passivation in this disclosure may be targeted at sidewall passivation, the initial recess 180 may be formed prior to the passivation process. In various embodiments, the first anisotropic plasma etch may be a first part of the cyclic etch process, and it may be performed in a suitable plasma processing chamber equipped with one or more plasma sources such as inductively coupled plasma (ICP), capacitively couple plasma (CCP), microwave plasma (MW), or others. A portion of the carbon-containing layer 120 is etched to form an initial recess 180 that corresponds to the pattern of the hard mask layer 130. At this stage, the initial recess 180 has a depth less than the thickness of the carbon-containing layer 120. In one embodiment, the initial recess 180 has a depth of around a quarter of the carbon-containing layer 120, but in other embodiments, it may be less than the quarter. The initial recess 180 is to be extended stepwise by cycles of the cyclic etch process with sidewall passivation to form a high aspect ratio (HAR) feature of the carbon-containing layer 120 as described further below.

In various embodiments, the first plasma etch process may be a reactive ion etching (RIE) process, and may use an etch gas, for example, comprising an oxygen-containing gas (e.g., $O_2$ or $CO_2$), a sulfur-containing gas (e.g., $SO_2$ or COS), or a nitrogen containing gas (e.g., $N_2$), or a hydrogen-containing gas (e.g., $H_2$ or $NH_3$). The etch gas may be a mixture of any of the example gases above mixed at any ratio with any combination. In addition, in certain embodiments, the etch gas may further comprise an optional admixture of inert gas comprising Ar, He, Xe, Kr, or Ne. In certain embodiments, the RIE process may be performed at a total gas flow between 1 sccm and 5000 sccm, a pressure between 1 mTorr and 760 Torr, a temperature between −100° C. and 200° C., and an operating frequency between 100 kHz and 10 GHz. In various embodiments, the RIE process may be performed with a process time between 10 s and 120 s, for example, 10 s to 30 s in one embodiment. To illustrate, in one embodiment, an etch time of the RIE process is 60 s, a pressure is 15 mTorr, a source power is 1500 W, a bias power is 400 W, an $O_2$ flow rate is 200 sccm, a $SO_2$ flow rate is 200 sccm, and an Ar flow rate is 50 sccm. The etch gas of the RIE process may be selected to provide good etch selectivity to mask materials such as $SiO_2$, silicon nitride, and SiON that may be used for the hard mask layer 130. In other embodiments, the source power and/or the bias power may be pulsed. Further, process parameters for the plasma etch process may be optimized with respect to subsequent passivation steps (e.g., FIGS. 1D and 1E) to provide good selectivity to a sidewall protective layer.

FIG. 1D illustrates a cross sectional view of the substrate 100 after a first exposure to a metal-containing precursor gas.

After forming the initial recess 180, an atomic layer deposition (ALD) of passivation layer may be performed. The first step of the ALD process may comprise exposing the substrate 100 to a metal-containing precursor gas to form an intermediate layer 170A over the carbon-containing layer 120 in the initial recess 180. In various embodiments, the exposure to the metal-containing precursor gas is performed in the absence of a plasma. At this stage, the metal-containing precursor gas may be adsorbed over the carbon-containing layer 120 in the initial recess 180 and may react with a surface of the carbon-containing layer 120. The intermediate layer 170A may be primarily adsorbed species of the metal-containing precursor gas. The metal-containing precursor gas and process parameters may be selected to provide good selectivity to the hard mask layer 130, although not required. In the illustrated example embodiment in FIG. 1D, the adsorption of the metal-containing precursor gas on the carbon-containing layer 120 is not selective to the hard mask layer 130, wherein the intermediate layer 170A is formed over both the carbon-containing layer 120 and the hard mask layer 130. Further, the absence of plasma-excitation during the exposure to the metal-containing precursor gas may advantageously enable conformal formation of the intermediate layer 170A in the initial recess 180.

In various embodiments, the metal-containing precursor gas may comprise a refractory metal such as tungsten (W), niobium (Nb), and molybdenum (Mo). In one or more embodiments, other metals such as tin (Sn) and titanium (Ti) may be used for the metal-containing precursor gas. In one embodiment, silicon (Si) may be used as a metal-equivalent in the metal-containing precursor. In various embodiments, the metal in the metal-containing precursor gas may comprise a halide of the metal (e.g., $WF_6$; $SiBr_4$, $SiI_4$, $SnBr_4$, $SnCl_4$, $NbF_5$, $NbCl_x$, $TiCl_4$, $MoF_6$, and $MoCl_x$). In one embodiment, the metal-containing precursor gas may be a mixture of any of these gases at any ratio. In addition, in certain embodiments, the metal-containing precursor gas may further comprise an optional admixture of inert gas. For example, the admixture may comprise Ar, He, Xe, Kr, or Ne. In certain embodiments, the formation of the intermediate layer 170A may be performed at a total gas flow between 1 sccm and 5000 sccm, a pressure between 5 mTorr and 760 Torr, and a temperature between −100° C. and 200° C. In various embodiments, the exposure to the metal-containing precursor gas may be performed with a process time between 1 s and 100 s, for example, 10 s to 300 s in one embodiment. Some process parameters such as flow rate, pressure may be selected to provide sufficient coverage of the sidewalls by the intermediate layer 170A, while keeping process time as short as possible for better process efficiency.

FIG. 1E illustrates a cross sectional view of the substrate 100 after a first exposure to a co-reactant gas.

After forming the intermediate layer 170, the substrate 100 may be exposed to the co-reactant gas to form a passivation layer 170B. In various embodiments, the exposure to the co-reactant gas may modify the intermediate layer 170A chemically or physically to form the passivation layer 170B. Further, in certain embodiments, compared to the intermediate layer 170A, the passivation layer 170B may have improved etch resistivity, and thereby better sidewall passivation, in subsequent plasma etch processes. The exposure to the co-reactant gas may be a plasma process or a non-plasma process.

In certain embodiments, the co-reactant gas may comprise oxygen or nitrogen, for example, $H_2O$ or $NH_3$, and the exposure may be performed in the absence of a plasma. Although not wishing to be limited by any theory, the exposure may induce hydrolysis or ammonolysis to modify the surface (e.g., the surface of the intermediate layer 170A) such that further adsorption of the metal-containing precursor gas in the subsequent deposition cycles may be enabled or enhanced.

In alternate embodiments, the co-reactant gas may comprise oxygen and hydrogen, or hydrogen and nitrogen, and the exposure may be performed under a plasma condition. In one or more embodiments, the co-reactant gas may comprise a first hydrogen-containing gas, a first oxygen-containing gas, or molecular nitrogen ($N_2$). Examples of the first hydrogen-containing gas comprise $H_2$, $CH_4$, HBr, $CH_3F$, $H_2O$, $NH_3$, and combinations thereof. Examples of the first oxygen-containing gas comprise $O_2$, CO, $CO_2$, and combinations thereof. In certain embodiments, the co-reactant gas may be a mixture comprising $H_2/N_2$, $H_2/O_2$, $H_2/CO$, $H_2/CO_2$, or $H_2/H_2O$. In some embodiments where the co-reactant gas comprises hydrogen, the co-reactant gas may further comprise an admixture gas comprising $O_2$, $CO_2$, CO, or $N_2$ mixed at any ratio.

Plasma processing systems and parameters for a plasma-on exposure step may be selected to achieve the optimized sidewall passivation by the passivation layer 170B. For example, in certain embodiments, it may be desired to have plasma systems such as inductively coupled plasma (ICP) or microwave plasma (MW) suitable for generating high density radicals for $H_2$ plasma. Further, in some embodiments, oxidative and/or nitrogen species may at least partially induce oxidation and/or nitridation of the intermediate layer 170A.

In addition, in certain embodiments, the co-reactant gas may further comprise an optional admixture of inert gas comprising Ar, He, Xe, Kr, or Ne. In certain embodiments, the exposure to the co-reactant gas may be performed at a total gas flow between 1 sccm and 5000 sccm, a pressure between 1 mTorr and 760 Torr, and a temperature between −100° C. and 200° C. In various embodiments, the exposure to the co-reactant gas may be performed with a process time between 1 s and 300 s, for example, 1 s to 30 s in one embodiment. To illustrate in one embodiment, a process time is about 10-60 s, a pressure is about 5 mTorr to 1 Torr, a source power is about 500 W to 2500 W, a bias power is about 0 W to 500 W, an $H_2$ flow rate is about 100 sccm to 400 sccm, and an $N_2$ flow rate is about 10 sccm to 75 sccm. Some process parameters such as flow rate, pressure may be selected to provide sufficient modification of the intermediate layer 170A, while keeping process time as short as possible for better process efficiency.

In various embodiments, the formations of the intermediate layer 170A and the passivation layer 170B may be primarily self-limiting processes. Accordingly, to grow the passivation layer 170B to a target thickness, the two exposure steps (FIGS. 1D and 1E) to the metal-containing precursor gas and the co-reactant gas may be cyclically repeated for any number of times. Thus, the formation of the passivation layer 170B can be seen as atomic layer deposition (ALD) or pseudo-ALD, which can advantageously enable conformal layer deposition. After a sufficient thickness of the passivation layer 170B is obtained by the ALD process, the etching may be resumed to extend the initial recess 180 (FIG. 1F).

FIG. 1F illustrates a cross sectional view of the substrate 100 after a second anisotropic plasma etch.

At this stage, the second anisotropic etch extends and deepens the initial recess 180 and forms an extended recess 182. With the carbon-containing layer 120 being etched anisotropically, the initial recess 180 extends below the passivation layer 170B. In one embodiment, the extended recess 182 at this stage has a depth of about a half of the carbon-containing layer 120, but in other embodiments, it may have a different depth. During the second anisotropic plasma etch process, the passivation layer 170B provides sidewall passivation, thereby maintaining a conformal profile of the extended recess 182. The presence of the passivation layer 170B reduces or prevents "bowing," which is an undesired widening of an opening of a recess feature near the top of sidewalls of the recess feature. This bowing may result in a widening of the critical dimension of a semiconductor device, and may ultimately also cause a collapse of fabricated features. The embodiment methods may mitigate or eliminate "bowing" by an enhanced sidewall passivation.

In various embodiments, the second anisotropic plasma etch process may be a second reactive ion etching (RIE) process. In various embodiments, the second RIE process may use the same etch gas and process parameters as the first RIE process. In certain embodiments, the second RIE process may use a modified etch gas composition and process parameters different from the first RIE process.

As a result of further etching, a new surface of the carbon-containing layer 120 is exposed at the sidewalls of the extended portion of the extended recess 182 as illustrated in FIG. 1F. Although the etch process may be continued in one embodiment, an additional passivation process may be performed (FIG. 1G) to passivate the newly exposed sidewall surfaces.

Figure 1G:
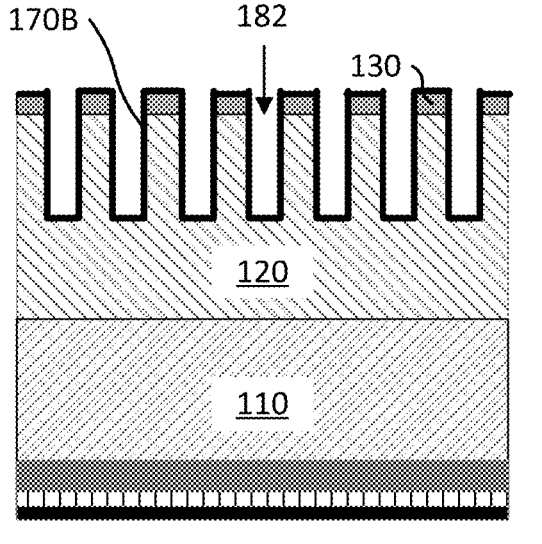

FIG. 1G illustrates a cross sectional view of the substrate 100 after a second exposure to the metal-containing precursor gas followed by a second exposure to the co-reactant gas.

In FIG. 1G, another ALD of passivation layer may be performed to replenish the passivation layer 170B and also to cover the entire sidewalls of the extended recess 182. The same process of ALD as described above may be used based on the cycles of the exposure to the metal-containing precursor gas and the exposure to the co-reactant gas.

By performing a plurality of cycles of the cyclic etch and ALD process in accordance with various embodiments as illustrated above (e.g., FIGS. 1C-1E, respectively corresponding the anisotropic plasma etch process, the exposure to the metal-containing precursor gas, and the exposure to the co-reactant gas), the initial recess 180 may be extended stepwise without much bowing or widening a critical dimension thanks to the sidewall passivation by the passivation layer 170B. In various embodiments, any number of cycles may be performed until a desired level of etching may be achieved.

Figure 1H:
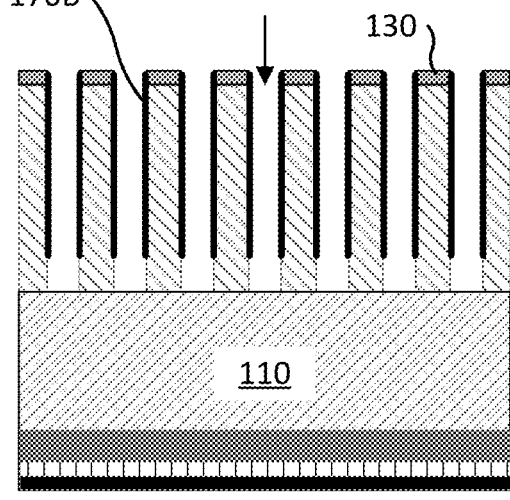

FIG. 1H illustrates a cross sectional view of the substrate after a plurality of etch and passivation cycles.

Figures 1I, 1J:
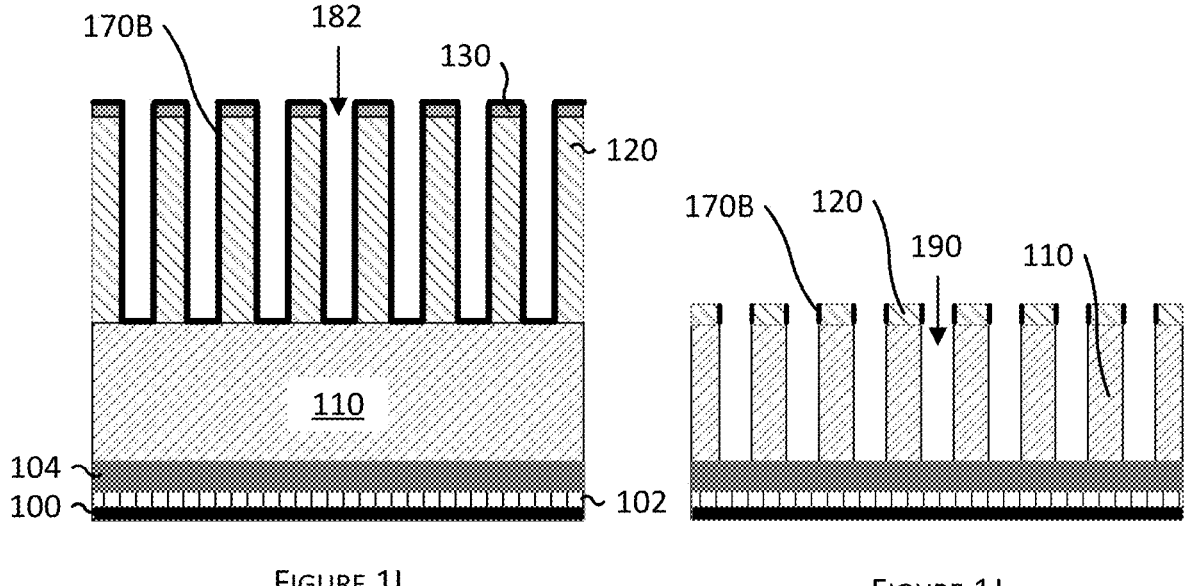

In FIG. 1H, the extended recess 182 reaches to, and exposes the underlying layer 110. The passivation layer 170B may be shorter in length than the final depth of the extended recess 182. In certain embodiments, a subsequent step of fabrication may immediately follow to etch the underlying layer 110 using the carbon-containing layer 120 as an etch mask (FIG. 1J). Alternately, a final passivation process may be performed (FIG. 1I).

FIG. 1I illustrates the substrate 100 after a final exposure to the metal-containing precursor gas followed by a final exposure to the co-reactant gas.

In FIG. 1I, in accordance with one or more embodiments, an optional final passivation series (a final ALD of passivation layer) may be performed after completing the patterning of the carbon-containing layer 120 and before etching the underlying layer 110. The ALD may be performed in the same fashion as described above. After the final passivation series, the passivation layer 170B entirely covers the sidewalls of the carbon-containing layer 120 within the extended recess 182. In another alternate embodiment, a final passivation may be performed by an exposure to the metal-containing precursor gas in the absence of a plasma but without exposing to the co-reactant gas.

FIG. 1J illustrates a cross sectional view of the substrate 100 after an anisotropic plasma etch of the underlying layer 110.

After completing the patterning of the carbon-containing layer 120, the anisotropic plasma etch process may be performed to pattern the underlying layer 110 with a high aspect ratio (HAR). As illustrated in FIG. 1J, a recess 190 may be formed in the underlying layer 110, transferring the pattern of the carbon-containing layer 120. The etch process may be performed using an appropriate etch technique such as reactive ion etching (RIE) process. In various embodiments, the etch gas for the RIE process may comprise a halogen-containing (e.g., F or Cl) etch gas. In certain embodiments, the etch gas may comprise a hydrofluorocarbon, a combination of a hydrocarbon and a fluorine-containing gas, or a combination of a fluorocarbon and a hydrogen-containing gas. In one or more embodiments, other gases such as a noble gas or a balancing agent may also be added to the process gas. In certain embodiments, the recess 190 has an aspect ratio between 5 and 100.

In one or more embodiments, the etch process for the underlying layer 110 may be performed in a different plasma system from the one used for the cyclic etch process for the carbon-containing layer 120; however, the two etch processes may be performed in a same plasma system in another embodiment.

Figure 2C:
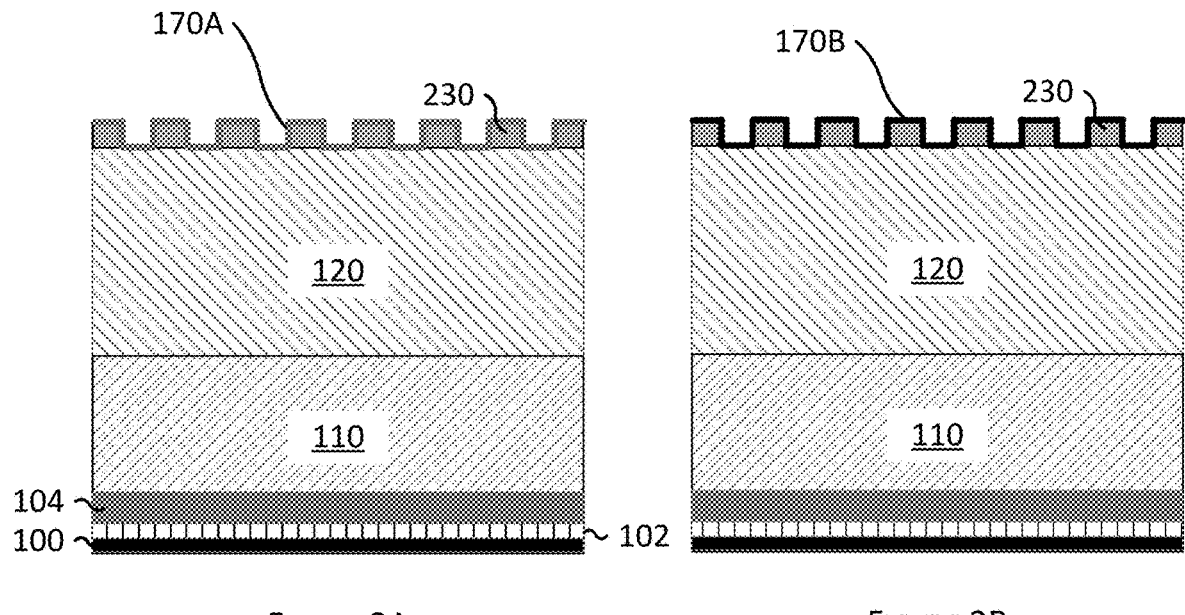
Figure 2C:
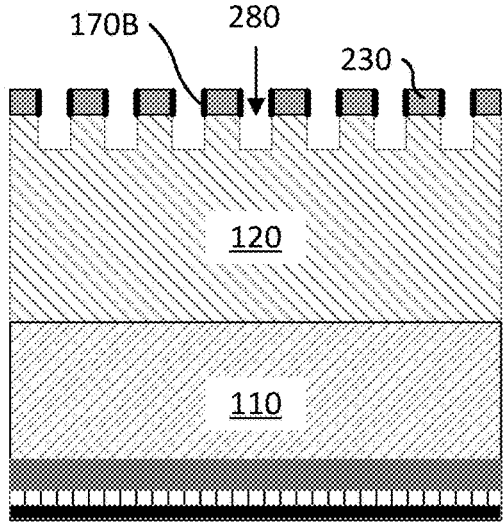

FIGS. 2A-2C illustrate cross sectional views of an example substrate 100 during a cyclic etch process and an ALD of a passivation layer at various stages in accordance with alternate embodiments.

While the cyclic etch process may start with an initial etch to form an initial recess that has sidewalls to be passivated as described referring to FIGS. 1B-1D, in alternate embodiments, the cyclic etch process may start with the ALD followed by a first anisotropic plasma etch process (FIGS. 2A-2C).

FIG. 2A illustrates a cross sectional view of a substrate 100 comprising a patterned hard mask layer 230, a carbon-containing layer 120, and an underlying layer 110, after a first exposure to a metal-containing precursor gas.

In FIG. 2A, the substrate 100 may has a layer stack structure identical to that of FIG. 1B of the prior embodiments, and therefore the details of each layer will not be repeated. At this stage, as illustrated in FIG. 2A, there is no recess formed in the carbon-containing layer 120. As already described above referring to FIG. 1D, the ALE of passivation layer may start with the exposure to the metal-containing precursor gas. In the illustrated example embodiment in FIG. 2A, the adsorption of the metal-containing precursor gas on the carbon-containing layer 120 is not selective to the hard mask layer 230, where the intermediate layer 170A is thereby formed over the carbon-containing layer 120 and the hard mask layer 230. In other words, in FIG. 2A, the sidewalls of the hard mask layer 230 is covered with the intermediate layer 170A.

FIG. 2B illustrates a cross sectional view of the substrate 100 after a first exposure to a co-reactant gas.

In FIG. 2B, similarly to the prior embodiment described above, the exposure to the co-reactant gas may modify the intermediate layer 170A chemically or physically to form a passivation layer 170B. The passivation layer 170B covers the sidewalls of the hard mask layer 130, which may advantageously provide sidewall passivation during a subsequent anisotropic plasma etch (FIG. 2C).

FIG. 2C illustrates a cross sectional view of the substrate 100 after a first anisotropic plasma etch.

The first anisotropic plasma etch process corresponds to the one described in FIG. 1C of the prior embodiments. In FIG. 2C, a recess 280 is formed by etching the carbon-containing layer 120. In the illustrated embodiments, since the passivation layer 170B is also formed over the hard mask layer 130, the portion of the passivation layer 170B on sidewalls of the hard mask layer 130 may improve the first anisotropic plasma etch process to form the recess 280 vertically without bowing or CD widening.

At this stage, on the other hand, the sidewalls of the recess 280 are not yet covered by the passivation layer 170B. After the first anisotropic plasma etch process, the process may proceed to another ALD of passivation layer as previously described to provide sidewall passivation for a next anisotropic plasma etch process. After the ALD process, the substrate 100 may be at a stage similar to FIG. 1E, and the following cycles are expected to produce similar structures (FIGS. 1E-1I).

Figures 3A, 3B:
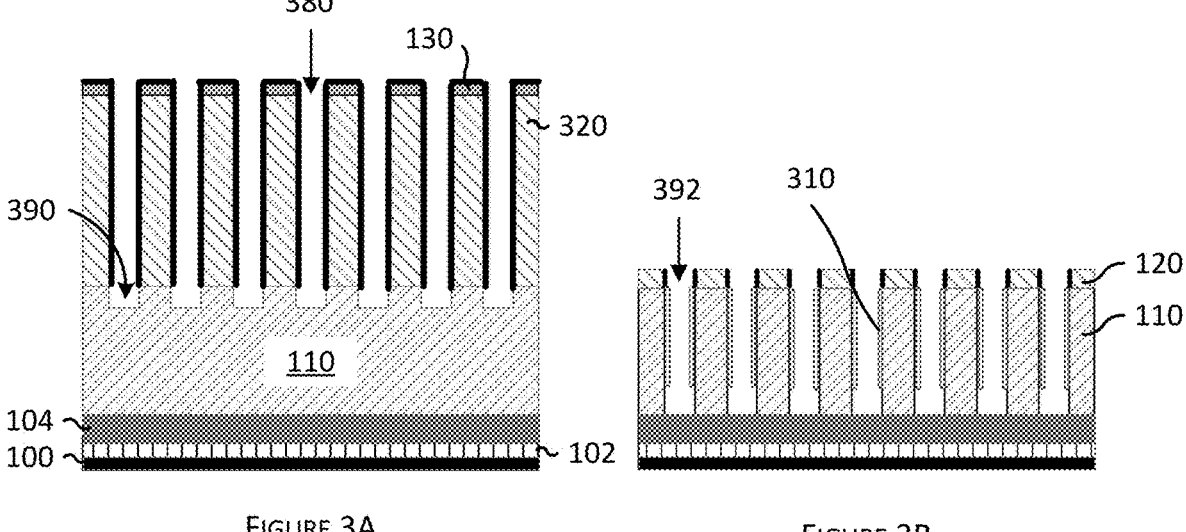

FIGS. 3A-3B illustrate cross sectional views of an example substrate during an example process of semiconductor fabrication comprising a cyclic etch process and an atomic layer deposition (ALD) of a passivation layer at various stages in accordance with other embodiments.

In addition to the passivation of the carbon-containing layer (e.g., FIGS. 1A-1J and 2A-2C), the methods of ALD may also be applied for a dielectric layer underlying the carbon-containing layer.

FIG. 3A illustrates a cross sectional view of the substrate 100 comprising a patterned carbon-containing layer 320 and an underlying layer 110 after an initial etch of the underlying layer 110.

In FIG. 3A, the substrate 100 may has a layer stack structure similar to that of FIG. 1I of the prior embodiments, and therefore the details of each layer will not be repeated. At this stage, as illustrated in FIG. 3A, patterning a carbon-containing layer is complete and the patterned carbon-containing layer 320 is used as an etch mask to pattern the underlying layer 110. The initial etch is also performed to form an initial recess 390 in the underlying later.

In various embodiments, as previously described, the underlying layer 110 may comprise films of dielectric and/or conductive materials, such as oxide, silicon oxide, silicon nitride, or alternating silicon oxide/silicon nitride layers (O/N/O/N layer stack) among others.

A passivation layer may be formed over the sidewalls of the initial recess 390 using the ALD methods, and an anisotropic plasma etch process may be performed to extend the initial recess 390. In various embodiments, similar to the process flows described in prior embodiments, the sidewall passivation (i.e., the exposure to the metal-containing precursor gas and the exposure to the co-reactant gas) and the etch process may be cyclically repeated for any number of times to gradually extend the initial recess 390 into the underlying layer 110 until a target depth may be achieved. The metal-containing precursor gas and the co-reactant gas may be the same or similar to those described above.

FIG. 3B illustrates a cross sectional view of the substrate 100 after the ALD of the passivation layer and an anisotropic plasma etch of the underlying layer.

In FIG. 3B, the cycles of etch and passivation may be repeated to gradually extend the initial recess 390 of FIG. 3A and to form an extended recess 392 without substantial bowing or CD widening thanks to a passivation layer 310.

Figure 4:
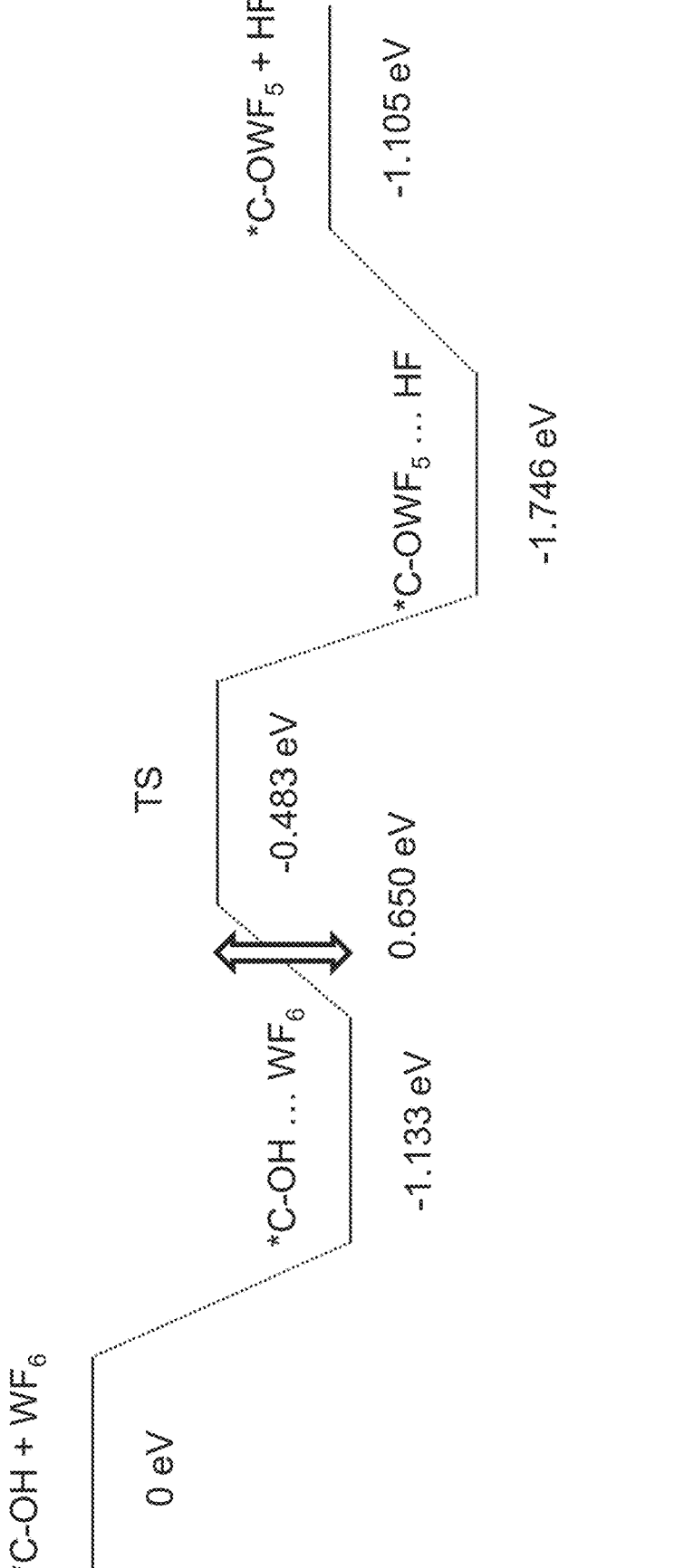
FIG. 4 illustrates an energy level diagram for adsorption and thermal reaction of $WF_6$ on a hydroxyl-terminated carbonaceous layer to form a passivation layer in accordance with an embodiment.

FIG. 4 illustrates an energy level diagram for adsorption and thermal reaction of $WF_6$ on a hydroxyl-terminated carbonaceous layer to form a passivation layer in accordance with an embodiment.

The inventors of this application calculated through simulation the formation energy of a possible surface species as a result of $WF_6$ gas exposure. As illustrated in FIG. 4, the formation of $*C$—$OWF_5$ surface species as a possible passivation layer or its intermediate on the hydroxy-terminated carbonaceous layer is thermodynamically favorable by about $-1.105$ eV. Further, the formation energy is found to be greater than some of the other non-metal adsorbate examples ($-0.623$ eV for $H_3SiNR_2$ adsorption and $-0.645$ eV for $BCl_3$ adsorption), which supports the superior adsorption affinity of $WF_6$ on the surface.

The formation of the surface species may be self-limiting since the $*C$—$OH$ is only present at the surface and only $*C$—$OH$ may provide the active side for the precursor (e.g., $WF_6$) to bind and form chemical bonds ($*C$—$OWF_5$). The self-limiting nature of the process may improve the conformal formation of the passivation layer, which may be particularly beneficial for sidewall passivation in high-aspect ratio (HAR) features.

The use of a metal halide such as $WF_6$ may also improve the etching performance of the carbon-containing layer by eliminating or minimizing the formation of residues during the etch process. Some conventional adsorbates for passivation such as silane (e.g., $H_3SiNR_2$) may form a basic species (e.g., amine) on surface during the passivation process. This basic species may react with acidic etch gas (e.g., $SO_2$) during the etch process and leads to the formation of undesired solid salt residue, which can cause damage to the device being formed over the substrate as well as the processing tool. Using the metal halide can advantageously avoid forming any basic species and thereby solid salt residue.

Figure 5:
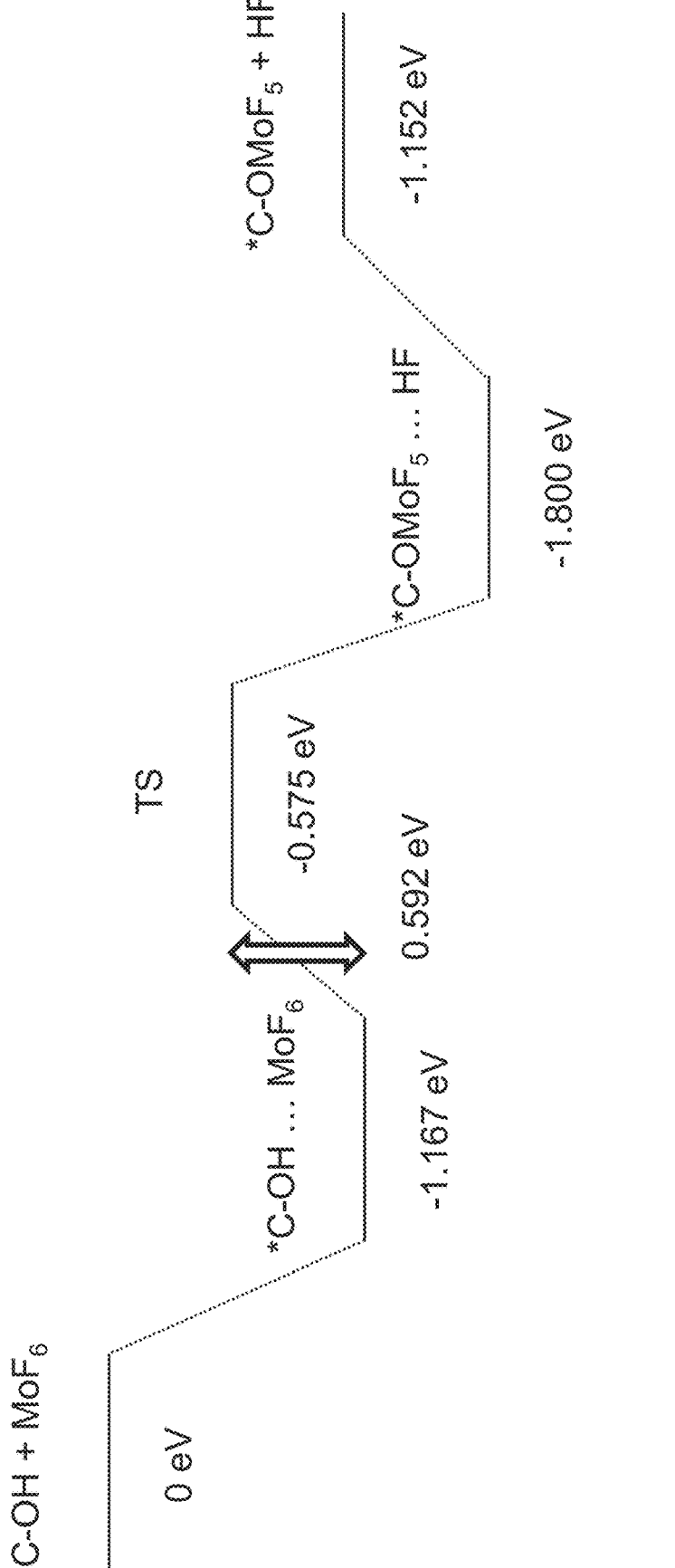
FIG. 5 illustrates an energy level diagram for adsorption and thermal reaction of $MoF_6$ on a hydroxyl-terminated carbonaceous layer to form a passivation layer in accordance with an embodiment.

FIG. 5 illustrates an energy level diagram for adsorption and thermal reaction of $MoF_6$ on a hydroxyl-terminated carbonaceous layer to form a passivation layer in accordance with an embodiment.

Another example calculation of the formation energy of a possible surface species is conducted for $MoF_6$ gas exposure. As illustrated in FIG. 5, the formation of $*C$—$OMoF_5$ surface species as a possible passivation layer or its intermediate on the hydroxy-terminated carbonaceous layer is thermodynamically favorable by about $-1.152$ eV, confirming the ability of a variety of metal halide to adsorb on the surface of the hydroxy-terminated carbonaceous layer.

Figure 6:
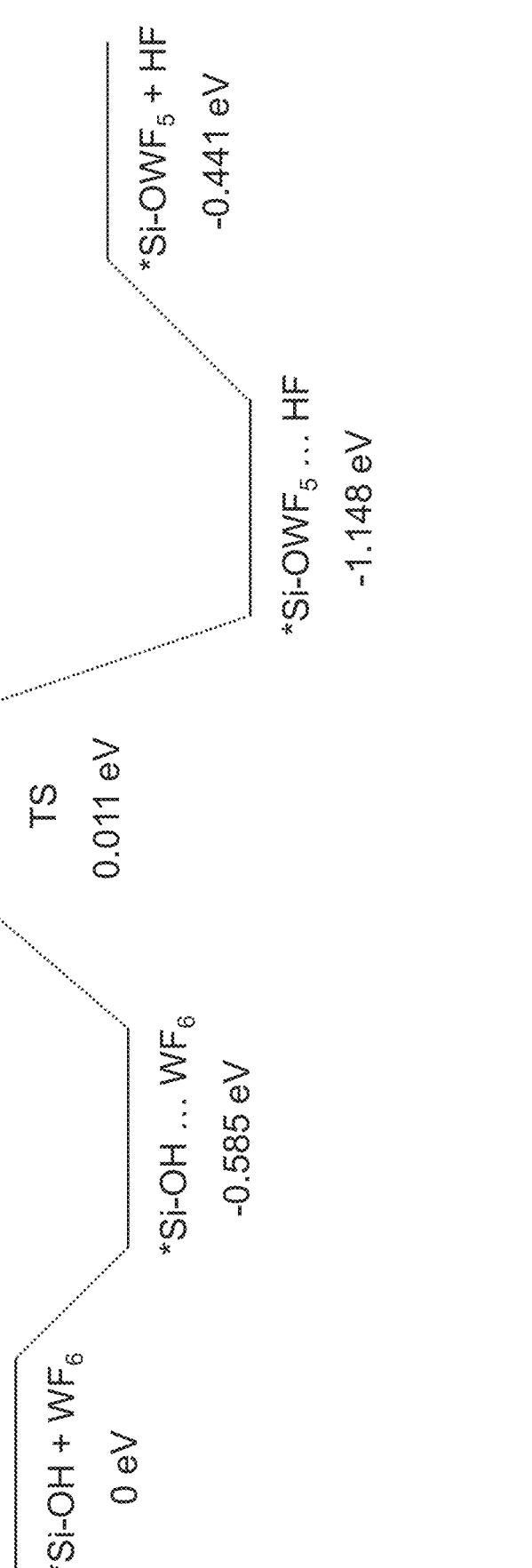
FIG. 6 illustrates an energy level diagram for adsorption and thermal reaction of $WF_6$ on a hydroxyl-terminated silicon-containing layer to form a passivation layer in accordance with an embodiment.

FIG. 6 illustrates an energy level diagram for adsorption and thermal reaction of $WF_6$ on a hydroxyl-terminated silicon-containing layer to form a passivation layer in accordance with an embodiment.

Further, a similar calculation of the formation energy of a possible surface species is conducted for $WF_6$ gas exposure on the hydroxyl-terminated silicon-containing layer to examine the applicability of the ALD method to various surfaces. As illustrated in FIG. 6, the formation of $*Si$—

$OWF_5$ surface species as a possible passivation layer or its intermediate on the hydroxy-terminated silicon-containing layer is thermodynamically favorable by about $-0.441$ eV. The data supports the applicability of the ALD methods using $WF_6$ for a silicon-containing layer as described above referring to FIGS. 3A-3B. For example, the ALD methods of passivation layer may be applied to passivate a dielectric layer (e.g., silicon oxide, silicon nitride, or oxide/nitride layer stack) during a plasma etch process to form HAR features in the dielectric layer for 3D-NAND applications.

Figure 7A:
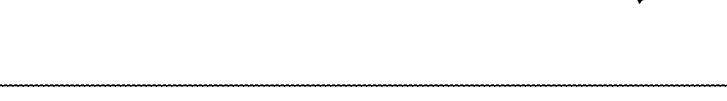
Figure 7A:
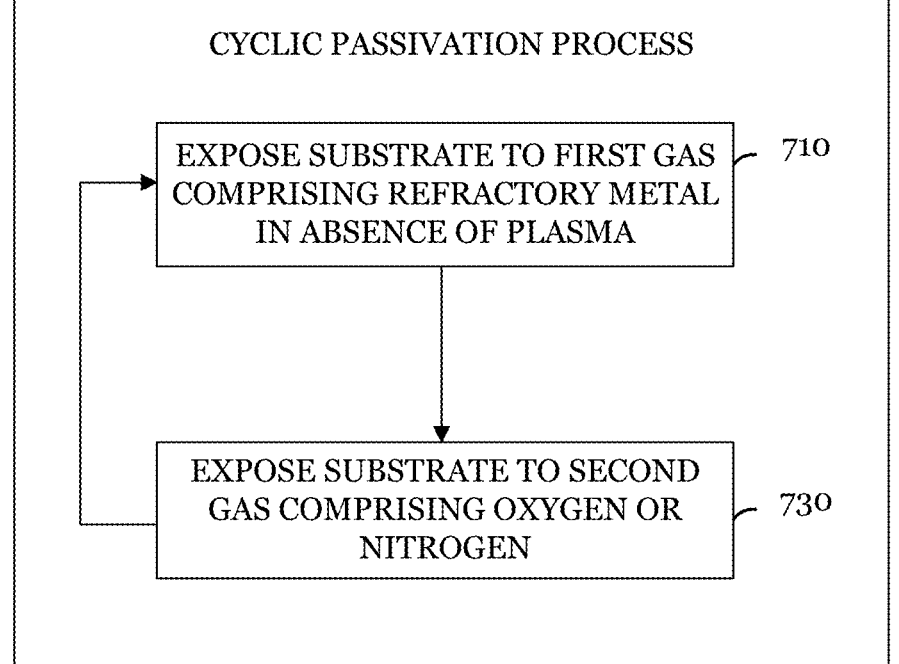
Figure 7B:
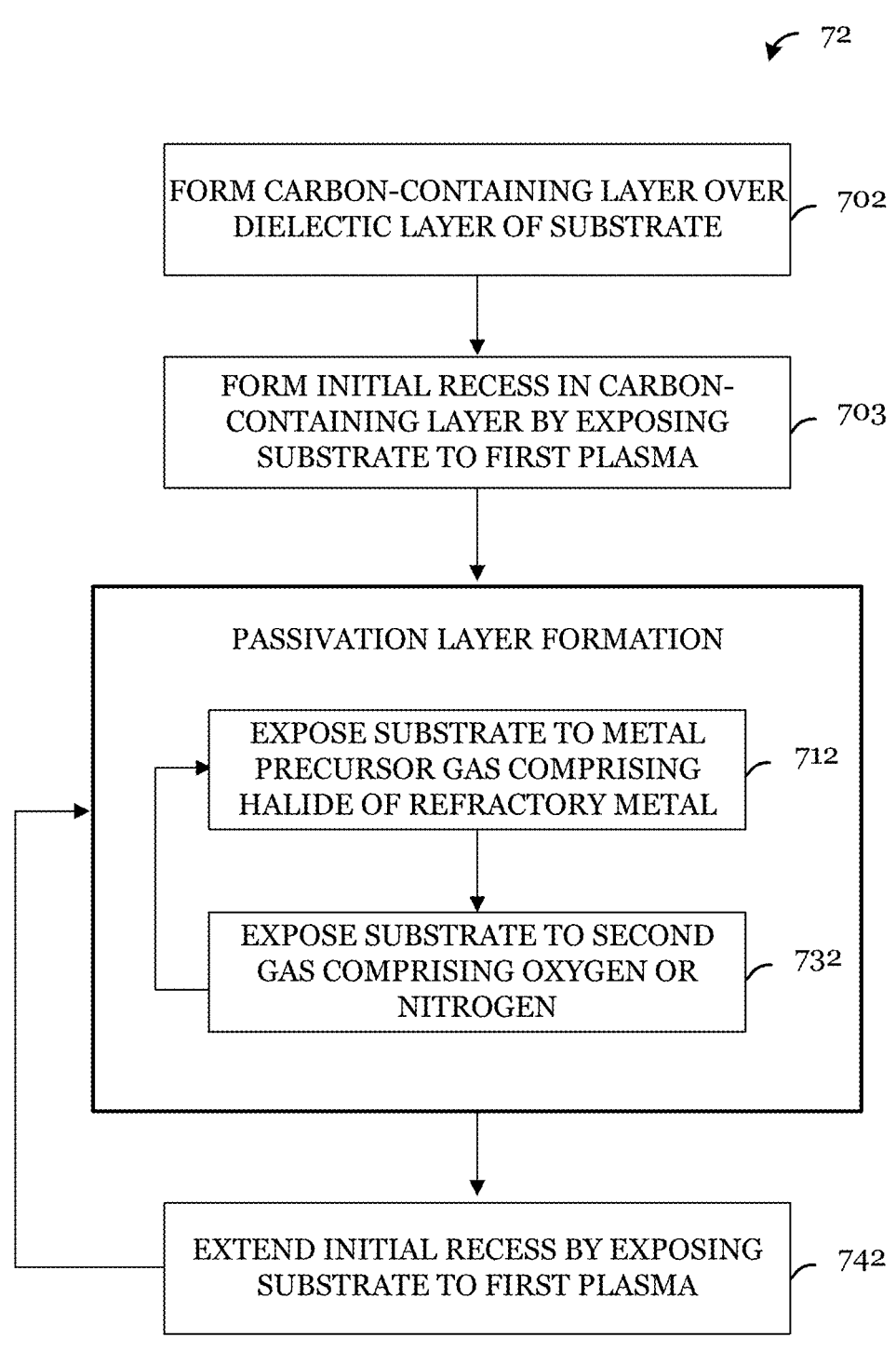
Figure 7C:
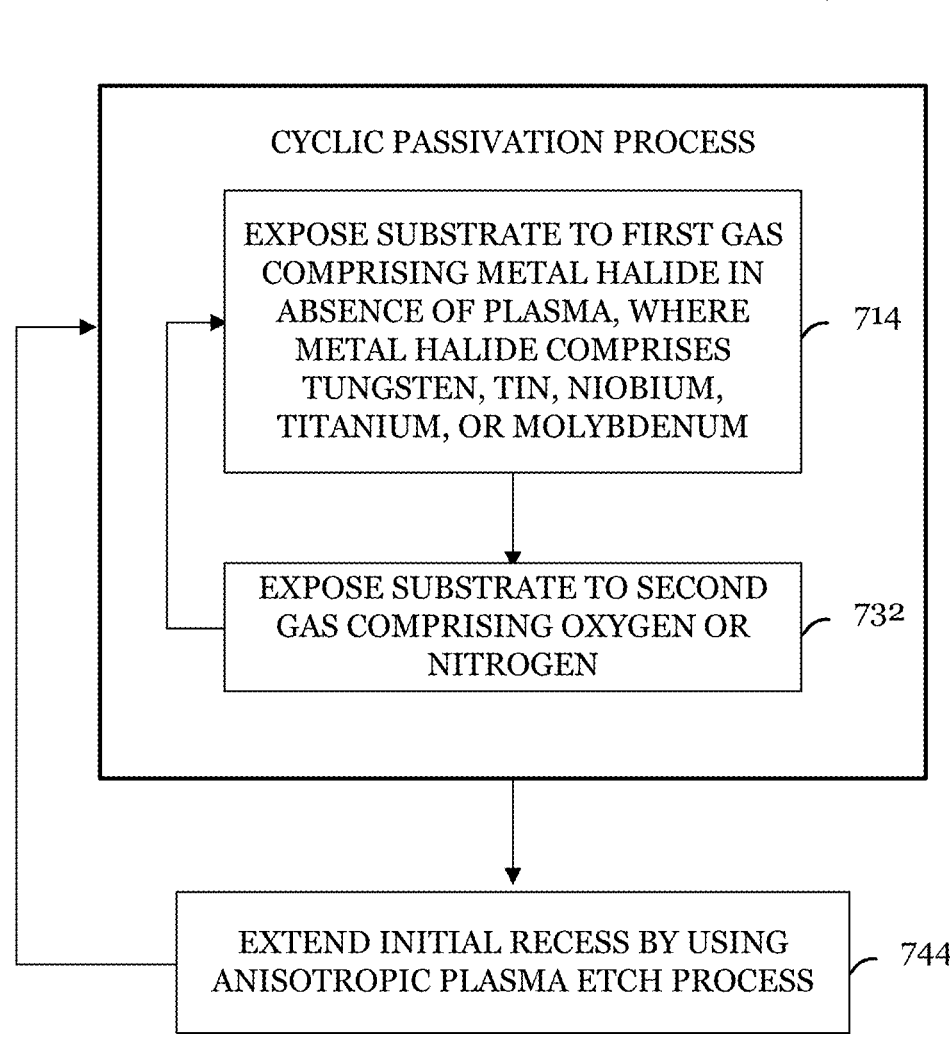
Figure 8:
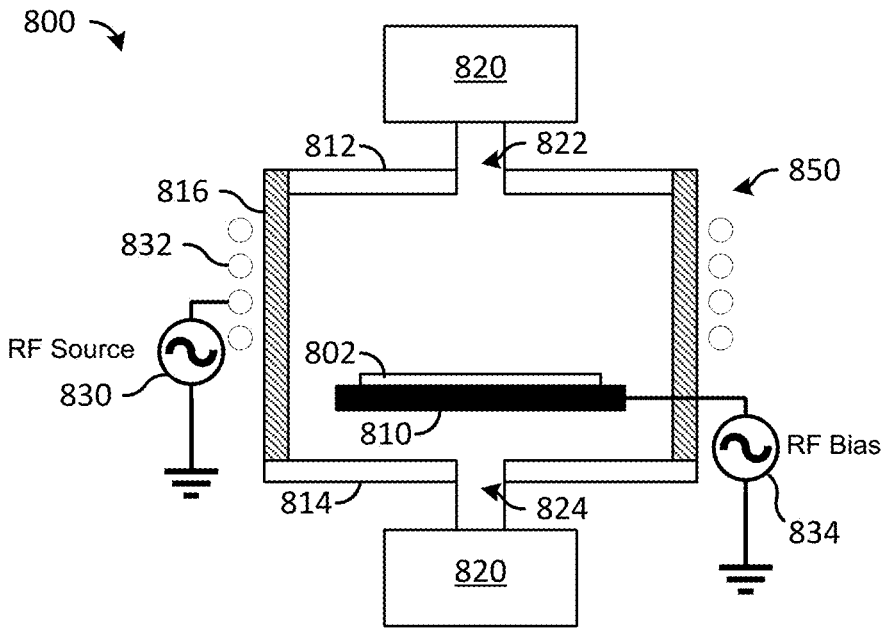
FIG. 8 illustrates an example plasma processing tool in accordance with an embodiment of this disclosure.

FIGS. 7A-7C illustrate process flow charts of methods of ALD of passivation layer in accordance with various embodiments. These process flows can be followed with the figures discussed above (e.g., FIGS. 1A-1J) and hence will not be described again.

In FIG. 7A, a process flow 70 comprises a cyclic passivation process to form a passivation layer over sidewalls of a recess in a carbon-containing layer over a substrate. The cyclic passivation process may start with exposing the substrate to a first gas comprising a refractory metal in the absence of a plasma (block 710, FIG. 1D), followed by exposing the substrate to a second gas comprising oxygen or nitrogen (block 730, FIG. 1E). In certain embodiments, the two exposure steps may be repeated for any number of times to grow a sufficient thickness of the passivation layer.

In FIG. 7B, another process flow 72 starts with forming a carbon-containing layer over a dielectric layer of a substrate (block 702, FIG. 1A), followed by forming an initial recess in the carbon-containing layer by exposing the substrate to a first plasma (block 703, FIG. 1C). Subsequently, a passivation layer may be formed over the sidewalls of the initial recess by exposing the substrate to a metal precursor gas comprising a halide of a refractory metal (block 712, FIG. 1D), and exposing the substrate to a second gas comprising oxygen or nitrogen (block 732, FIG. 1E). In certain embodiments, the two exposure steps may be repeated for any number of times. After the passivation layer formation, the initial recess may then be extended by exposing the substrate to the first plasma, where the passivation layer covers the sidewalls during the extending (block 742, FIG. 1F). In one or more embodiments, the passivation layer formation and the exposure to the first plasma to extend the initial recess may be cyclically repeated for any number of times to achieve a target etch depth in the carbon-containing layer (FIGS. 1G-1H).

In FIG. 7C, yet another process flow 74 starts with a cyclic passivation process to form a passivation layer over sidewalls of an initial recess, where each cycle of the cyclic passivation process comprises exposing the substrate to a first gas comprising a metal halide in the absence of a plasma (block 714, e.g., FIG. 1D), and exposing the substrate to a second gas comprising oxygen or nitrogen (block 732, e.g., FIG. 1E). The metal halide may comprise tungsten, tin, niobium, titanium, or molybdenum. In certain embodiments, the two exposure steps may be repeated for any number of times. After the cyclic passivation process, the initial recess may then be extended by extending the initial recess using an anisotropic plasma etch process, where the passivation layer covers the sidewalls during the extending (block 744, e.g., FIG. 1F or FIG. 3B). In one or more embodiments, the cyclic passivation process and the anisotropic plasma etch process may be cyclically repeated for any number of times to achieve a target etch depth. In one embodiment, the passivation layer may be formed over a carbon-containing layer (e.g., FIG. 1E), and in another embodiment, it may be formed over a dielectric layer below the carbon-containing layer (e.g., FIG. 3B).

FIG. 8 illustrates an example plasma processing tool 800 used for the cyclic etch process and ALD of passivation layer in accordance with an embodiment of this disclosure.

In FIG. 8, the plasma processing tool 800 comprises a plasma processing chamber 850 configured to sustain plasma directly above a substrate 802 loaded onto a substrate holder 810. A process gas may be introduced to the plasma processing chamber 850 through a gas inlet 822 and may be pumped out of the plasma processing chamber 850 through a gas outlet 824. The gas inlet 822 and the gas outlet 824 may comprise a set of multiple gas inlets and gas outlets, respectively. The gas flow rates and chamber pressure may be controlled by a gas flow control system 820 coupled to the gas inlet 822 and the gas outlet 824. The gas flow control system 820 may comprise various components such as high pressure gas canisters, valves (e.g., throttle valves), pressure sensors, gas flow sensors, vacuum pumps, pipes, and electronically programmable controllers. An RF bias power source 834 and an RF source power source 830 may be coupled to respective electrodes of the plasma processing chamber 850. The substrate holder 810 may also be the electrode coupled to the RF bias power source 834. The RF source power source 830 is shown coupled to a helical electrode 832 coiled around a dielectric sidewall 816. In FIG. 8, the gas inlet 822 is an opening in a top plate 812 and the gas outlet 824 is an opening in a bottom plate 814. The top plate 812 and bottom plate 814 may be conductive and electrically connected to the system ground (a reference potential).

The configuration of the plasma processing tool 800 described above is by example only. In alternative embodiments, various alternative configurations may be used for the plasma processing tool 800. For example, inductively coupled plasma (ICP) may be used with RF source power coupled to a planar coil over a top dielectric cover, or capacitively coupled plasma (CCP) generated using a disc-shaped top electrode in the plasma processing chamber 850, the gas inlet and/or the gas outlet may be coupled to the sidewall, etc. Pulsed RF power sources and pulsed DC power sources may also be used in some embodiments (as opposed to continuous wave RF power sources). Further, microwave plasma (MW) or other suitable systems may be used. In various embodiments, the RF power, chamber pressure, substrate temperature, gas flow rates and other plasma process parameters may be selected in accordance with the respective process recipe. In some embodiments, the plasma processing tool 800 may be a resonator such as a helical resonator. In one embodiment, a plasma system suitable for generating high density radicals for H2 plasma may be used.

The type of plasma may depend on applications. For plasma etching a carbon-containing layer such as amorphous carbon layer (ACL) as discussed in various embodiments, an inductively coupled plasma (ICP) may be advantageous over a capacitively coupled plasma (CCP). On the other hand, plasma etching a dielectric layer may be performed better using CCP than ICP in terms of anisotropy, etch profile with a controllable range of distortion, and etch selectivity. However, the methods of etching and ALD described in this disclosure may be applied to any type of plasma processing system (e.g., CCP, ICP, microwave, etc.).

In addition, embodiments of the present invention may be also applied to remote plasma systems as well as batch systems. For example, the substrate holder may be able to support a plurality of wafers that are spun around a central axis as they pass through different plasma zones.

In certain embodiments, the etching of the carbon-containing layer and the ALD of passivation layer may advantageously be performed using the same processing tool (e.g., the plasma processing tool 800), although the ALD process may or may not use any plasma.

As described in various embodiments, passivation layer formed concurrently with the plasma etch process helps prevents or reduce bowing, sidewall roughness, and striation. In various embodiments, the sidewall passivation steps may comprise the formation of a passivation layer using a metal-containing precursor gas in the absence of a plasma, followed by a treatment with a co-reactant gas with or without using a plasma. The passivation layer may be grown by atomic layer deposition (ALD) or in a pseudo-ALD fashion by repeating the two exposure steps. In the formation of a high aspect ratio feature of the carbon-containing layer, the embodiment methods may advantageously mitigate bowing and striation, and improve the sidewall surface roughness without compromising the etch rate, thereby providing a carbon mask with an improved quality. Furthermore, the use of the metal-containing precursor (e.g., $WF_6$) may advantageously prevent the formation of a salt during a subsequent etch process. A better carbon mask performance in the subsequent etch processes enabled by the embodiment methods may improve the process efficiency of the overall device fabrication.

Example embodiments of the invention are described below. Other embodiments can also be understood from the entirety of the specification as well as the claims filed herein.

Example 1. A method for processing a substrate that includes: forming a passivation layer over sidewalls of a recess in a carbon-containing layer over a substrate by a cyclic passivation process including a plurality of cycles, each of the plurality of cycles including, exposing the substrate to a first gas including a refractory metal in the absence of a plasma, and after exposing to the first gas, exposing the substrate to a second gas including oxygen or nitrogen.

Example 2. The method of example 1, where the exposing to the second gas includes exposing the substrate to a first plasma generated from the second gas.

Example 3. The method of one of examples 1 or 2, further including, after the cyclic passivation process exposing the substrate to a second plasma generated from a third gas including oxygen, sulfur, nitrogen, or hydrogen to extend the recess in the carbon-containing layer, the passivation layer covering the sidewalls during the exposing to the second plasma.

Example 4. The method of one of examples 1 to 3, further including, before forming the passivation layer, forming the recess by performing an anisotropic plasma etch process by using an etch mask including a patterned mask layer over the carbon-containing layer, the substrate including the carbon-containing layer and the patterned mask layer.

Example 5. The method of one of examples 1 to 4, where the patterned mask layer includes silicon nitride, silicon oxide ($SiO_2$), or silicon oxynitride (SiON).

Example 6. The method of one of examples 1 to 5, where the carbon-containing layer includes amorphous carbon.

Example 7. The method of one of examples 1 to 6, where the refractory metal includes tungsten, niobium, or molybdenum.

Example 8. The method of one of examples 1 to 7, where the first gas includes a halide of the refractory metal.

Example 9. The method of one of examples 1 to 8, where the second gas includes water ($H_2O$) or ammonia ($NH_3$).

Example 10. A method for processing a substrate that includes: forming a carbon-containing layer over a dielectric layer of a substrate; forming an initial recess in the carbon-containing layer by exposing the substrate to a first plasma, the initial recess including sidewalls; forming a passivation layer over the sidewalls by exposing the substrate to a metal precursor gas including a halide of a refractory metal, and exposing the substrate to a second gas including oxygen or nitrogen; and extending the initial recess by exposing the substrate to the first plasma, the passivation layer covering the sidewalls during the extending.

Example 11. The method of example 10, where the forming of the passivation layer further includes repeating the exposing to the metal precursor gas and the exposing to the second gas to gradually grow the passivation layer.

Example 12. The method of one of examples 10 or 11, where the forming of the passivation layer is performed in a in a plasma processing chamber having a plasma source, where the exposing to the metal precursor gas is performed without powering the plasma source, and where the exposing to the second gas includes: purging the plasma processing chamber with the second gas including hydrogen, powering the plasma source to generate a second plasma from the second gas, and exposing the substrate to the second plasma.

Example 13. The method of one of examples 10 to 12, where the halide of the refractory metal includes tungsten fluoride, niobium fluoride, niobium chloride, molybdenum fluoride, or molybdenum chloride.

Example 14. The method of one of examples 10 to 13, further including repeating the forming of the passivation layer and the extending of the initial recess to expose a portion of the dielectric layer at the bottom of the extended recess.

Example 15. The method of one of examples 10 to 14, further including, after the repeating, patterning the dielectric layer by an anisotropic plasma etch process using the carbon-containing layer as an etch mask.

Example 16. A method for processing a substrate that includes: performing a plurality of cycles of a cyclic passivation process to form a passivation layer over sidewalls of an initial recess, each cycle of the cyclic passivation process including exposing the substrate to a first gas including a metal halide in the absence of a plasma, the metal halide including tungsten, tin, niobium, titanium, or molybdenum; and exposing the substrate to a second gas including oxygen or nitrogen; extending the initial recess using an anisotropic plasma etch process, the passivation layer covering the sidewalls during the extending.

Example 17. The method of example 16, where the initial recess is formed in a dielectric layer including silicon oxide or silicon nitride, and where the anisotropic plasma etch process is performed using a patterned carbon-containing layer as an etch mask.

Example 18. The method of one of examples 16 or 17, where the initial recess is formed in a stack of alternating layers of silicon oxide and silicon nitride.

Example 19. The method of one of examples 16 to 18, where the initial recess is formed in an amorphous carbon layer (ACL), and where the anisotropic plasma etch process is performed using a patterned hard mask layer including silicon as an etch mask.

Example 20. The method of one of examples 16 to 19, the extended recess after the anisotropic plasma etch process has an aspect ratio between 5 and 100.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for processing a substrate, the method comprising:

forming a passivation layer over sidewalls of a recess in a carbon-containing layer of the substrate by a cyclic passivation process comprising a plurality of cycles, the substrate comprising the carbon-containing layer over a dielectric layer, each of the plurality of cycles comprising, exposing the substrate to a first gas comprising a refractory metal in the absence of a plasma, and after exposing to the first gas, exposing the substrate to a second gas comprising oxygen or nitrogen; and patterning the dielectric layer using the carbon-containing layer as an etch mask.

2. The method of claim 1, wherein the exposing to the second gas comprises exposing the substrate to a first plasma generated from the second gas.

3. The method of claim 1, further comprising, after the cyclic passivation process, exposing the substrate to a second plasma generated from a third gas comprising oxygen, sulfur, nitrogen, or hydrogen to extend the recess in the carbon-containing layer, the passivation layer covering the sidewalls during the exposing to the second plasma.

4. The method of claim 1, further comprising, before forming the passivation layer, forming the recess by performing an anisotropic plasma etch process with a patterned mask layer over the carbon-containing layer.

5. The method of claim 4, wherein the patterned mask layer comprises silicon nitride, silicon oxide ($SiO_2$), or silicon oxynitride (SiON).

6. The method of claim 1, wherein the carbon-containing layer comprises amorphous carbon.

7. The method of claim 1, wherein the refractory metal comprises tungsten, niobium, or molybdenum.

8. The method of claim 1, wherein the first gas comprises a halide of the refractory metal.

9. The method of claim 1, wherein the second gas comprises water ($H_2O$) or ammonia ($NH_3$).

10. A method for processing a substrate, the method comprising:

forming a carbon-containing layer over a dielectric layer of a substrate;

forming an initial recess in the carbon-containing layer by exposing the substrate to a first plasma, the initial recess comprising sidewalls;

forming a passivation layer over the sidewalls by exposing the substrate to a metal precursor gas comprising a halide of a refractory metal, and exposing the substrate to a second gas comprising oxygen or nitrogen; and extending the initial recess in the carbon-containing layer by exposing the substrate to the first plasma, the passivation layer covering the sidewalls of the carbon-containing layer during the extending.

11. The method of claim 10, wherein the forming of the passivation layer further comprises repeating the exposing to the metal precursor gas and the exposing to the second gas to gradually grow the passivation layer.

12. The method of claim 10, wherein the forming of the passivation layer is performed in a plasma processing chamber having a plasma source, wherein the exposing to the metal precursor gas is performed without powering the plasma source, and wherein the exposing to the second gas comprises:

purging the plasma processing chamber with the second gas, the second gas further comprising hydrogen, powering the plasma source to generate a second plasma from the second gas, and exposing the substrate to the second plasma.

13. The method of claim 10, wherein the halide of the refractory metal comprises tungsten fluoride, niobium fluoride, niobium chloride, molybdenum fluoride, or molybdenum chloride.

14. The method of claim 10, further comprising repeating the forming of the passivation layer and the extending of the initial recess to expose a portion of the dielectric layer at the bottom of the extended initial recess.

15. The method of claim 14, further comprising, after the repeating, patterning the dielectric layer by an anisotropic plasma etch process using the carbon-containing layer as an etch mask.

16. The method of claim 10, further comprising after extending the initial recess to expose a portion of the dielectric layer, patterning the dielectric layer by an anisotropic plasma etch process using the carbon-containing layer as an etch mask.

17. A method for processing a substrate, the method comprising:

forming a carbon-containing layer over a dielectric layer of a substrate;

forming an initial recess in the carbon-containing layer by exposing the substrate to a first plasma, the initial recess comprising sidewalls;

forming a passivation layer over the sidewalls by exposing the substrate to a metal precursor gas comprising a halide of a refractory metal, and exposing the substrate to a second gas comprising oxygen or nitrogen;

extending the initial recess by exposing the substrate to the first plasma, the passivation layer covering the sidewalls during the extending-extending;

repeating the forming of the passivation layer and the extending of the initial recess to expose a portion of the dielectric layer at a bottom of the extended initial recess; and after the repeating, patterning the dielectric layer by an anisotropic plasma etch process using the carbon-containing layer as an etch mask.

18. The method of claim 17, wherein the dielectric layer comprises silicon oxide or silicon nitride.

19. The method of claim 17, wherein the initial recess is formed in dielectric layer comprises a stack of alternating layers of silicon oxide and silicon nitride.

20. The method of claim 17, wherein the carbon-containing layer comprises amorphous carbon, forming the initial recess comprises using a patterned hard mask layer comprising silicon as an etch mask.

21. The method of claim 17, wherein patterning the dielectric layer comprises forming a recess in the dielectric layer with an aspect ratio between 5 and 100.

\* \* \* \* \*